United States Patent [19]
Foley

[11] Patent Number: 6,127,903
[45] Date of Patent: *Oct. 3, 2000

[54] FILTER WITH MANUALLY OPERABLE SIGNAL CARRIER GUIDES

[75] Inventor: Peter F. Foley, Los Altos Hills, Calif.

[73] Assignee: Broadcom HomeNetworking, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/947,220

[22] Filed: Oct. 8, 1997

[51] Int. Cl.$^7$ ...................................................... H03H 7/01
[52] U.S. Cl. ......................... 333/181; 333/12; 333/185; 333/182; 439/620
[58] Field of Search ............................. 333/12, 181, 182, 333/185; 439/395, 409, 410, 620

[56] References Cited

U.S. PATENT DOCUMENTS

| | | | |
|---|---|---|---|
| 2,802,083 | 8/1957 | Lapeyre | 439/409 X |
| 3,516,026 | 6/1970 | Curran et al. | 333/185 X |
| 4,822,297 | 4/1989 | Prince et al. | 439/395 |
| 5,061,913 | 10/1991 | Okochi et al. | 333/181 |
| 5,095,296 | 3/1992 | Parker | 333/12 X |
| 5,180,314 | 1/1993 | Gelin et al. | 439/620 X |
| 5,236,376 | 8/1993 | Cohen | 333/185 X |
| 5,373,277 | 12/1994 | Naito | 333/12 X |
| 5,846,098 | 12/1998 | Shiga et al. | 439/409 |

FOREIGN PATENT DOCUMENTS

| | | |
|---|---|---|
| 94 08 883 | 7/1994 | Germany. |
| 295 15 545 | 11/1995 | Germany. |
| 2 198 605 | 6/1988 | United Kingdom. |

*Primary Examiner*—Justin P. Bettendorf
*Attorney, Agent, or Firm*—Christie, Parker & Hale, LLP

[57] ABSTRACT

A filter apparatus includes a housing having a first body portion and a second body portion which mate together to enclose an accessible inner portion of the housing. Filtering elements disposed within the inner portion filter signals transmitted through a pair of signal carriers which pass through the inner portion. A pair of guides disposed within the inner portion maintain the electrical conductors in a predetermined positional relationship with certain of the filter elements. The guides are each actuated by placing a signal carrier against a predetermined portion of the guide and applying manual pressure against the signal carriers to cause the signal carrier to be pressed into a the predetermined positional relationship. Certain embodiments include contact push posts which pierce an insulating layer of a corresponding signal carrier to make electrical contact with the signal carrier. Other embodiments include a cutting element to sever the signal carriers to implement a four-terminal filter.

34 Claims, 12 Drawing Sheets

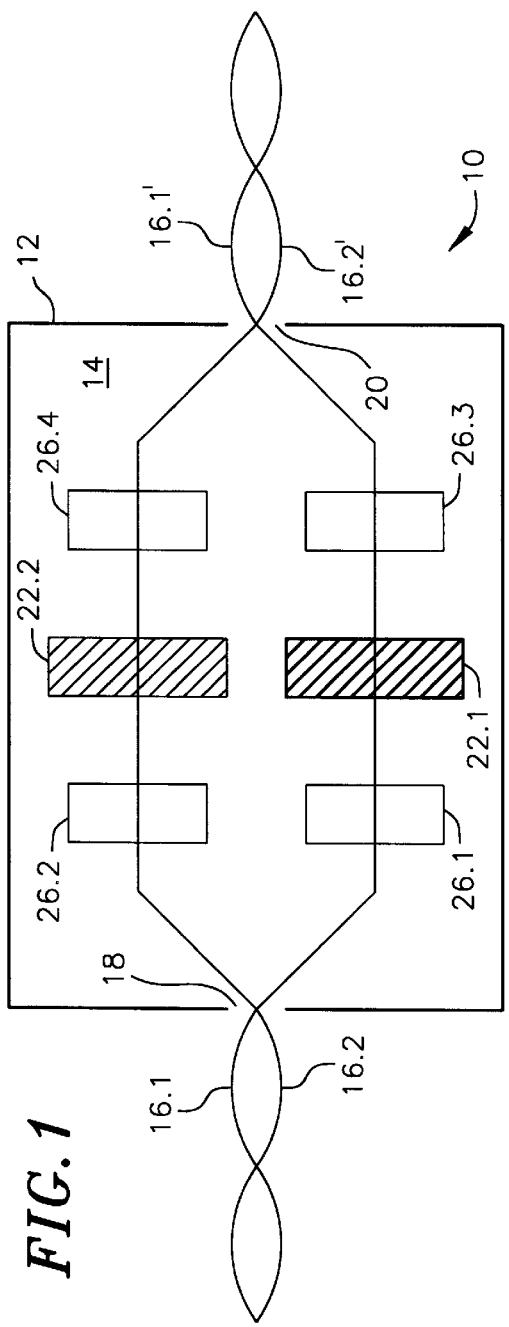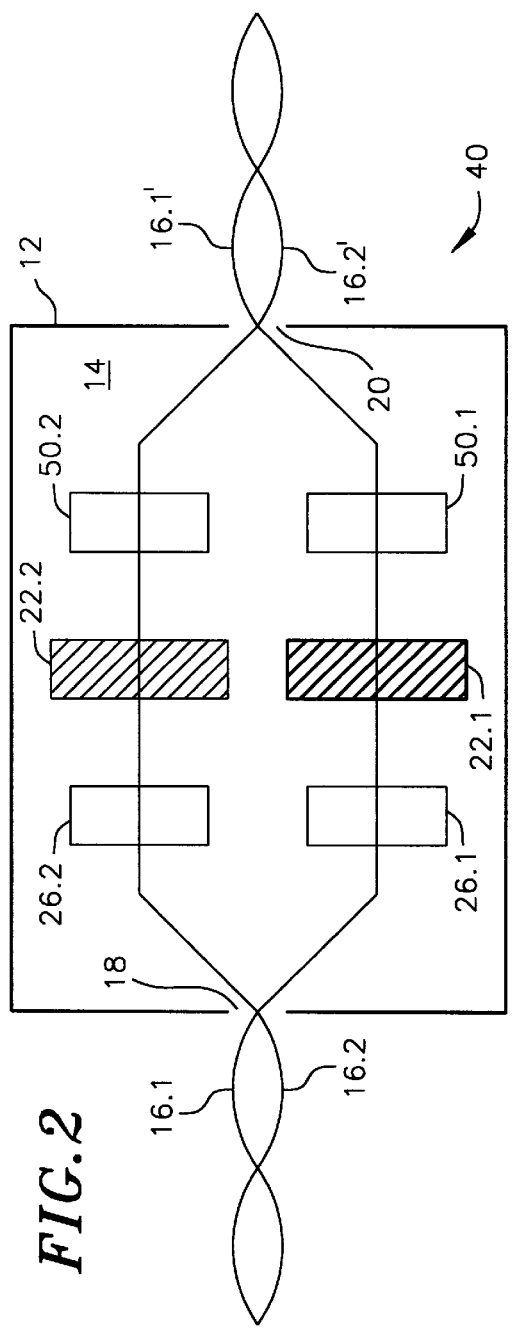

FILTER WITH MANUALLY OPERABLE SIGNAL CARRIER GUIDES

FIELD OF THE INVENTION

This invention pertains generally to the field of manually operable electrical connectors and more particularly to electric filters or like devices which are manually coupled to signal carriers.

BACKGROUND OF THE INVENTION

Sophisticated electronic devices such as computers, facsimile machines and copiers are commonly used in the business environment, and increasingly in the home environment. In the business environment, installation of electronic devices is frequently performed by trained personnel equipped with any necessary tools. In the home environment, cost considerations often require that electronic devices be installable by the average consumer to reduce the costs associated with professional installation. As a result, electronic devices used in the home require simplicity of installation for widespread consumer acceptance.

In general, many electronic devices are self-contained and thus do not require professional installation in either the home or the business environment. Computer networks are one notable exception. Typically, such networks require installation of appropriate wiring, together with specialized electronic devices to ensure proper network operation. Pending U.S. patent application entitled "HOME AREA NETWORK SYSTEM AND METHOD" (Ser. No. 08/924,449), filed on Aug. 28, 1997, which is assigned to the assignee of the present application describes a local area network which may be used within a home using existing Plain Old Telephone Service (POTS) Unshielded Twisted Pair (UTP) wiring at a customer premises. As described in the aforesaid patent application, such a system advantageously allows conventional POTS wiring, which is already installed in the home, to be used for both conventional call sending and receiving and at the same time to be used for computer networking. As further described in the aforesaid patent application, a passive low pass filter may be located at the Telephone Network Interface (TNI) at the demarcation between the subscriber loop and the customer premises to improve network performance.

Installation of a local area network in the home such as described in the aforesaid patent application would be greatly simplified and therefore far more desirable for potential users and customers if the aforesaid filter could easily be installed without the use of tools or specialized knowledge. Other types of filters or electrical devices would also benefit from such features.

SUMMARY OF THE INVENTION

In a principal aspect, the present invention provides simplified installation of a filter or similar type of electronic device. In accordance with the principal aspect of the invention, a signal carrier is electrically coupled to a filter by manual coupling of the signal carrier to appropriate components of the filter apparatus. Advantageously, no tools are required to sever the signal carrier or to position the signal carrier into an appropriate position to enable operation of the filter upon signals transmitted on the signal carrier.

In certain embodiments, the filter may contain filtering elements which modify the signals in the signal carrier in a desired way without electrically contacting the signal carrier. Alternatively, or in addition, the filter may also include filter elements which electrically contact the signal carrier. In the former embodiment, filters employing the principles of the present invention may contain guides which are actuated by manual force to hold the signal carriers in a predetermined positional relationship to the filter elements. In the latter embodiment, the guides contain a cutting surface which pierces an insulated layer of the signal carriers when the signal carriers are manually pressed against an appropriate portion of the guides. The filter elements may include ferrite elements, capacitive elements, clamping devices and other elements which modify electrical signals.

Embodiments employing the principles of the present invention advantageously allow coupling of signal carriers to the filter without use of tools and, consequently, are easy to use and present fewer risks of mis-installation or breakage due to improper use of tools or use of improper tools.

These and other features and advantages of the invention will be understood by considering the following detailed description of certain preferred embodiments. In the course of this description, reference will be made to the attached drawings.

BRIEF DESCRIPTION OF THE DRAWINGS

FIG. 1 shows a top view of a first embodiment of an apparatus which employs the principles of the present invention.

FIG. 2 shows a top view of a second embodiment of an apparatus which employs the principles of the present invention.

FIG. 2(a) shows an electrical schematic diagram of a filter implemented by the apparatus of FIG. 2.

FIG. 2(b) shows a side view of element 50 of FIG. 2(a).

DETAILED DESCRIPTION OF THE PREFERRED EMBODIMENTS

Figure 1A:
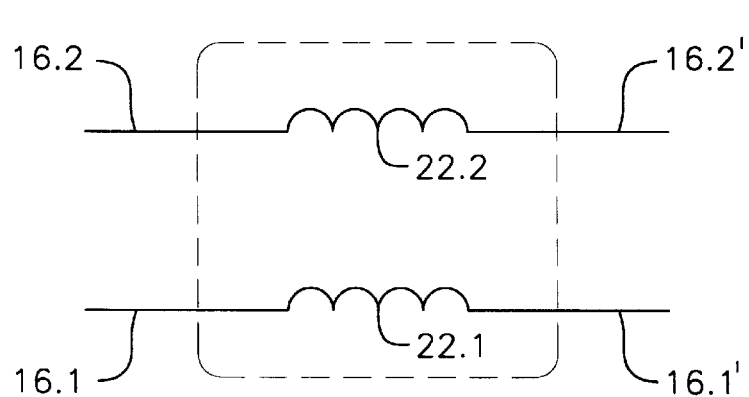
FIG. 1(a) is an electrical schematic diagram implemented by the apparatus of FIG. 1.

For ease of reference, like elements in the following description are labeled with the same reference numbers, and multiple instances of the same element are labeled with the same reference number together with a suffix to individually designate the specific instance of the element. For example, in the following description, element 26, which is shown in numerous places, is labeled and referred to individually as 26.1, 26.2, etc. Reference to each instance of an element is made without use of the suffix. For example a reference to element 26 refers to all instances (26.1, 26.2, etc.) of element 26.

The embodiments shown in the drawings and described herein are particularly well adapted for use in a home based local area network such as described in aforementioned patent application, Ser. No. 08/924,449, entitled "HOME AREA NETWORK SYSTEM AND METHOD" filed on Aug. 28, 1997, which is hereby incorporated by reference. Such embodiments however may find use in a number of other contexts. Moreover, as will become apparent to those skilled in the art in view of the following description, numerous modifications may be made to the embodiments disclosed herein.

Turning to FIG. 1, filter apparatus 10 includes a housing 12 which includes an interior portion 14. Interior portion 14 receives a pair of signal carriers 16 (shown individually as 16.1 and 16.2) through an opening 18 in the housing 12. Signal carriers 16 take the form of conventional POTS UTP wiring used in a customer premises. Such wiring typically takes the form of several twisted pairs of individually insulated copper wires. In each pair of wires, one wire is typically designated a "tip" wire and the other wire is typically designated as a "ring" wire. Ferrite elements 22 (shown individually as 22.1 and 22.2) filter signals transmitted by signal carriers 16. The signal carriers exit through a second opening 20 of the housing 12. Signal carriers 16.1 and 16.2 are designated upon exiting filter 10 as 16.1' and 16.2' to indicate the filtered signal carried by the signal carriers.

FIG. 1(a) shows a schematic diagram of the filter implemented by the filter apparatus 10 of FIG. 1. Ferrite elements 22.1 and 22.2 are shown in FIG. 1(a) as inductive elements 22.1 and 22.2 coupled in series with signal carriers 16.1 and 16.2 respectively. FIG. 1 shows a lower portion of ferrite elements 22.1 and 22.2. As explained in further detail below, housing 12, in certain embodiments, includes an upper portion which contains a corresponding upper portion to the ferrite elements 22.1 and 22.2. Those skilled in the art will appreciate that ferrite materials may only loosely be described as providing the function of the "inductors," shown schematically in FIG. 1(a). Typical ferrite materials, such as ferrite elements 22, are composed of ferromagnetic materials that can be magnetized to produce large magnetic flux densities in response to small applied magnetization forces (such as from signals on signal carriers 16). Ferrite materials exhibit magnetic properties which are dependent on the frequency at which they are excited. At high frequencies, typical ferrite materials are best viewed as frequency dependent resistors that attenuate the higher frequency components of signals which pass through the ferrite material. The ferrite elements 22 can be used to a low pass filter, such as described in the aforesaid patent application (Ser. No. 08/924,449), to attenuate signals above approximately 1.1 MHz.

Figure 1B:
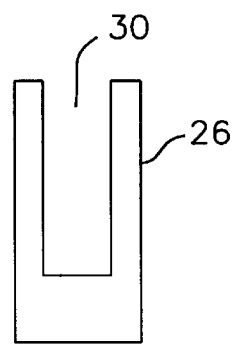
FIG. 1(b) shows a side view of element 26 of FIG. 1.
Figure 1C:
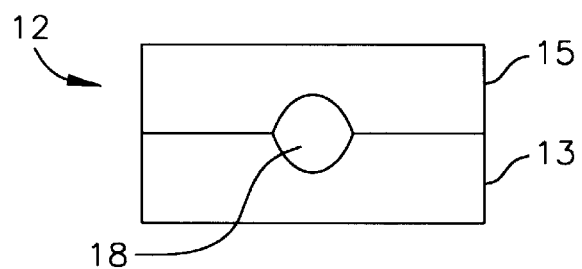
FIG. 1(c) shows a side view of element 12 of FIG. 1 in a closed position.
Figure 1D:
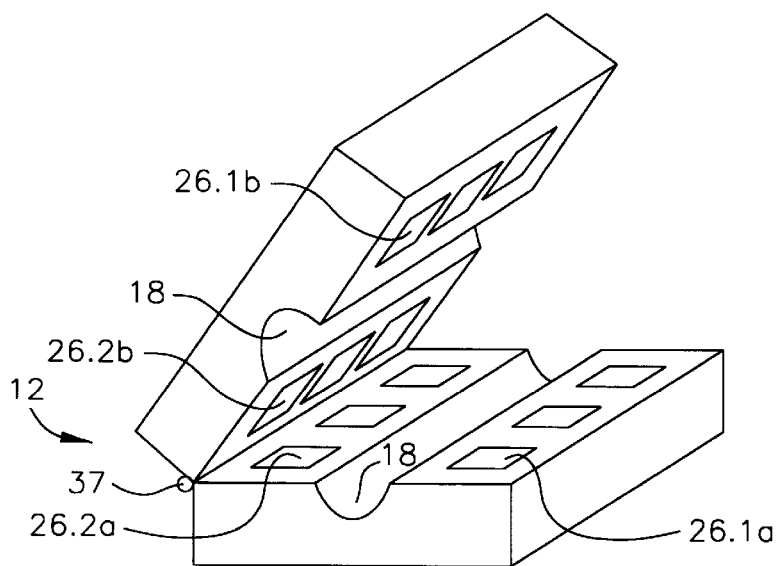
FIGS. 1(d) and 1(e) show alternative embodiments of a side view of element 12 of FIG. 1 in an open position.
Figure 1F:
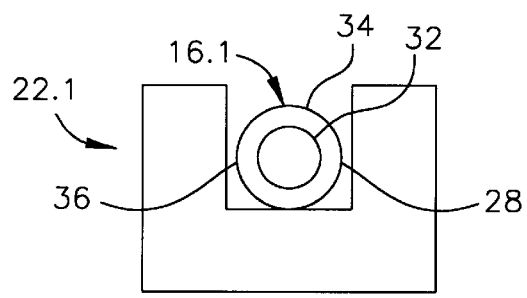
FIG. 1(f) shows a side view of elements 22 together with a cross-sectional view of element 16 of FIG. 1.
Figure 1E:
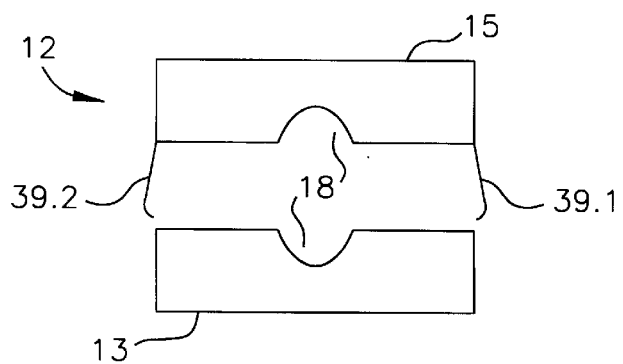
Figure 1G:
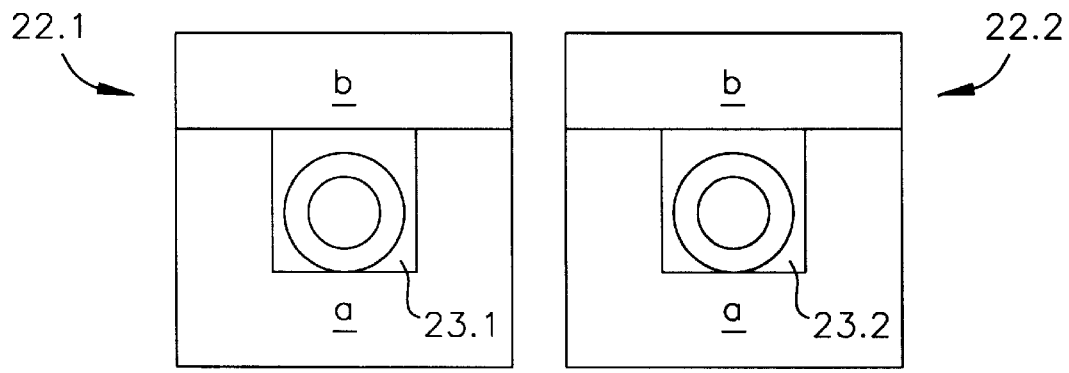
FIGS. 1(g) and 1(h) show side views of alternative embodiments of element 22 of FIG. 1.
Figure 1H:
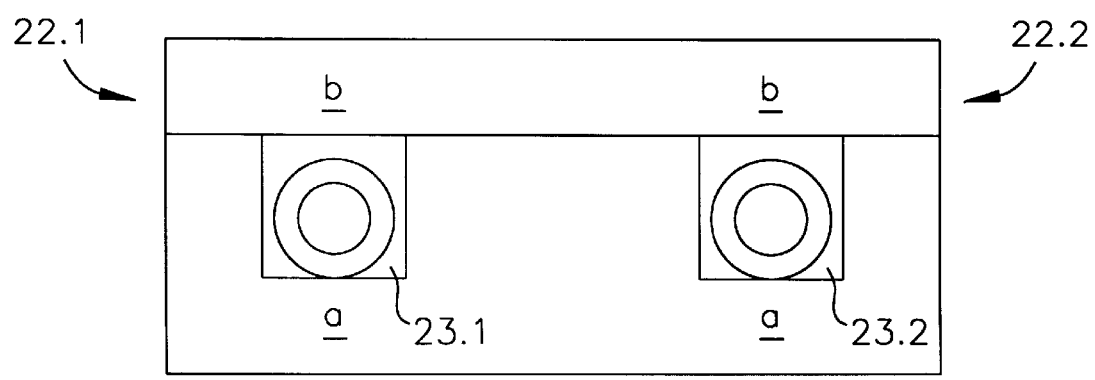
Figure 1I:
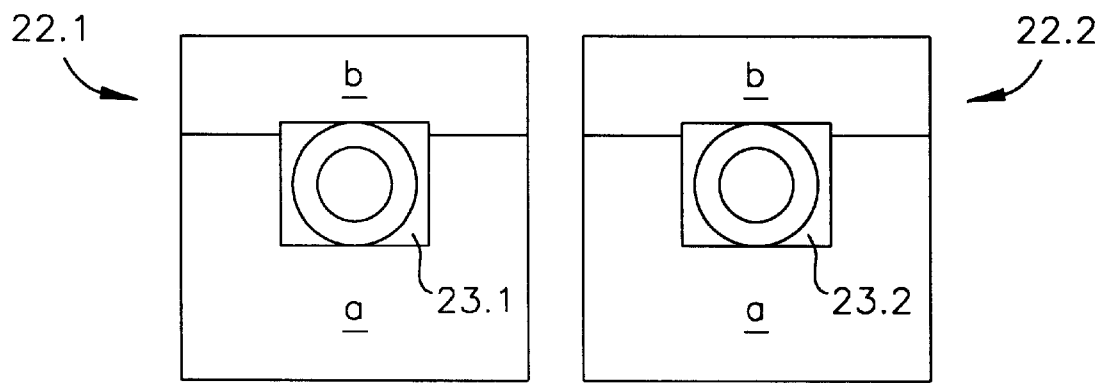
FIGS. 1(i) and 1(j) show alternative embodiments of element 23 of FIGS. 1(g) and 1(h).

Ferrite elements 22.1 and 22.2 are each shown in FIG. 1 as taking the form of a rectangular shaped block containing a groove (23.1 and 23.2 (FIG. 1(i)) respectively) to accept, and to guide, the corresponding signal carrier 16.1 or 16.2. As shown in side view in FIG. 1(g), ferrite elements 22.1 and 22.2 are physically separate and are therefore unconnected electrically. FIG. 1(g) shows the top portion of the ferrite elements together with the lower portion shown in top view in FIG. 1. In FIG. 1(g), the lower portion of the ferrite elements 22.1 and 22.2 are designated respectively as 22.1a and 22.2b 22.2a and the upper portions are designated respectively as 22.1b and 22.2b. The upper portion of each of the ferrite elements is preferably affixed to upper portion 15 of the housing 12, and is preferably aligned with the corresponding lower portion, as shown in FIG. 1(g), to form a conducting pathway between the upper portion and the lower portion when the housing is in a closed position such as shown in FIG. 1(c).

FIG. 1(h) shows an alternative embodiment where the ferrite elements 22.1 and 22.2 are formed out of a single block of ferrite material with two grooves, 23.1 and 23.2, formed therein to accept and to guide signal carriers 16.1 and 16.2 respectively. If the ferrite elements 22.1 and 22.2 are separate, then the elements will introduce differential mode attenuation into signals transmitted by signal carriers 16. If the ferrite elements 22.1 and 22.2 are joined by virtue of being formed from a single block, then the elements will advantageously introduce both differential mode and common mode attenuation into signals transmitted by signal carriers 16.

Figure 1J:
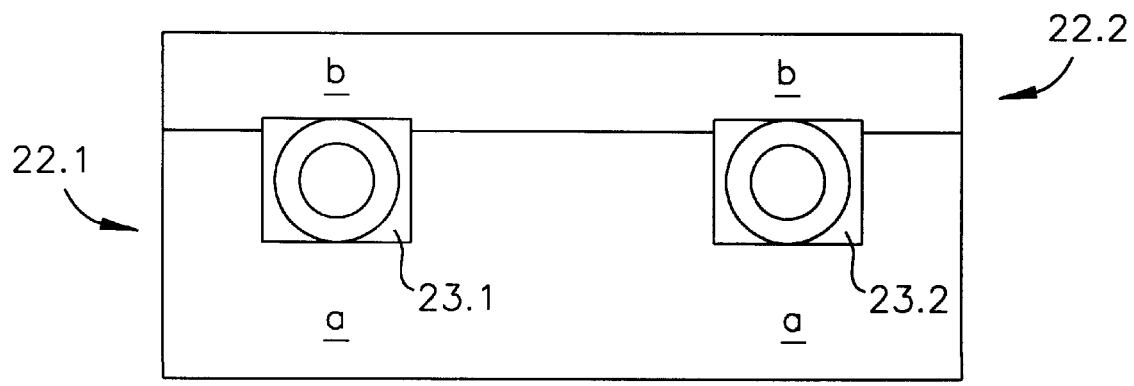

Ferrite elements 22.1 and 22.2 are each positioned to allow a corresponding signal carrier 16 to pass through groove 23.1 or 23.2 in the ferrite element 22.1 or 22.2 so as to inductively couple signals within signal carriers 16.1 and 16.2. The exact manner in which the groove is formed in the ferrite is not critical. FIGS. 1(g) and 1(h) show an embodiment in which the grooves 23.1 and 23.2 are formed entirely in the lower portion of the ferrite element. Alternatively, as shown in FIGS. 1(i) and 1(j), the grooves 23.1 and 23.2 may be formed partially in the upper and the lower portions of the ferrite element. The predetermined positional relationship of the signal carriers to the corresponding ferrite element determined primarily by the corresponding groove 23 and is facilitated by guide push posts 26. Guide push posts 26.1a and 26.1b maintain signal carrier 16.1 in predetermined positional relationship with ferrite element 22.1. Guide push posts 26.2a and 26.2b maintain signal carrier 16.2 in predetermined positional relationship with ferrite element 22.2. The positional relationships shown in the drawings are merely one example of the positional relationships which may be achieved. Other positional relationships may be achieved by varying the size of the grooves 23. The precise positional relationship of the ferrite elements to the signal carriers varies depending upon the filtering effect desired. Maximum filtering effect is typically achieved by having a tight fit of the signal carrier 16 in a corresponding groove 23.

A side view of guide push posts 26 is shown in FIG. 1(b). Guide push posts 26 as shown in FIG. 1(b) take the form of a slot 30 into which a signal carrier 16 is pressed. Advantageously, slot 30 of the guide push post 26 has a width which allows the signal carrier 16 to be manually pressed into the slot while constraining the signal carrier to maintain a predetermined positional relationship between the signal carrier and the associated ferrite element. The guide push post 26 shown in FIG. 1(b) is merely one example of the form which the guide push post may take. The exact structure used to hold the signal carriers 16.1 and 16.2 in positional relationship to the associated ferrite element is not critical. As a consequence, the guide push posts may be replaced with any number of structures which allow the signal carriers to be manually positioned into the predetermined positional relationships and which maintain the signal carriers in such position.

FIG. 1(f) shows a side view of the ferrite element with the corresponding signal carrier. As shown in FIG. 1(f), signal carrier 16.1 includes a conductor 32 surrounded by a insulating material 34. Ferrite element 22.1 is positioned in predetermined positional relationships 36 and 38 respectively with respect to signal carrier 16.1. Signal carrier 16.2 takes the same form as signal carrier 16.1 and is similarly positioned with respect to ferrite element 22.2

The ferrite elements 22 are merely one example of an inductive type filter element which can be used in accordance with the principles of the present invention. Advantageously, the ferrite elements 22 provide filtering of the signals contained in signal carriers 16.1 and 16.2 without requiring the use of tools or complex installation procedures to couple the filtering element to the signal carrier. All that is required is the signal carrier be inserted into guide push posts 26 and 28 and groove 23 to place and secure the signal carriers in the predetermined positional relationship with the ferrite element. The exact type of the ferrite element 22 however, is not critical.

The housing 12 provides structural integrity and physical protection for the devices contained within the housing. Preferably, the housing is formed of plastic or other non-conducting material to minimize any parasitic capacitive and inductive coupling which may occur between the signals on the signal carrier and the filter apparatus. Additionally, such a housing allows physical placement of the filter apparatus in areas with exposed live electrical elements.

Figure 4:
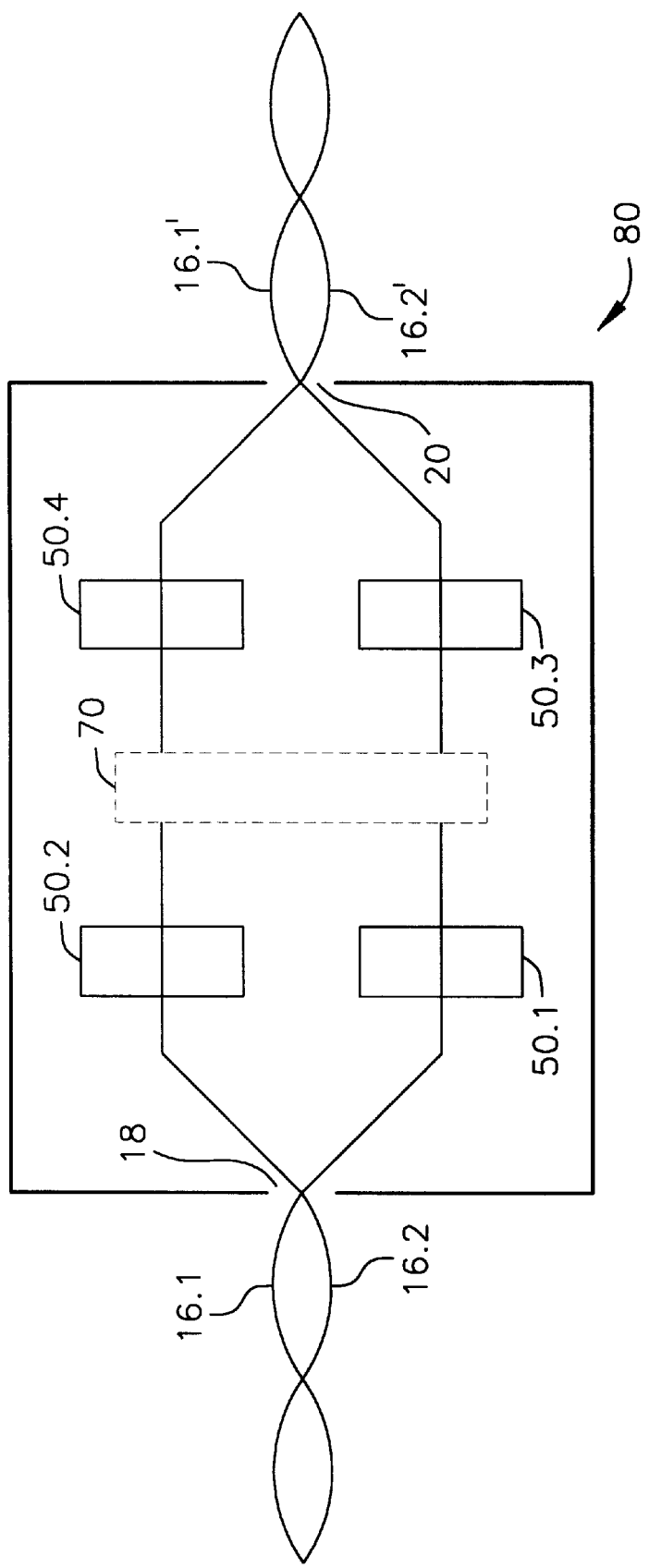
FIG. 4 shows a top view of a fourth embodiment of an apparatus which employs the principles of the present invention.

Although providing the foregoing advantages, a housing is not necessary and is not required. In embodiments which have no housing, and thus have the advantage of lower cost, the lower portion 13 of the housing 12 takes the form of a rigid or substantially rigid material upon which the various components of the filter apparatus are mounted. In such embodiments, the ferrite element may be modified to a structure which allows surrounding, either completely or substantially, of the signal carriers with the ferrite element to achieve a desired filtering effect. Alternatively, a filter such as shown in FIG. 4 may be used to eliminate use of ferrite materials.

FIGS. 1(c), 1(d) and 1(e) show side views of the housing 12. In FIG. 1(c), housing 12 is shown as having lower portion 13 and an upper portion 15. Lower portion 13 is shown from a top view in FIG. 1. The housing 12 is shown in FIG. 1(c) in a closed position. FIGS. 1(d) and 1(e) show alternative embodiments of the housing 12. In FIG. 1(d), upper portion 15 is mounted to lower portion 13 by way of a hinge type mechanism 37 which allows upper portion 15 to rotate into an open position as shown in FIG. 1(d) to allow access to inner portion 14. In FIG. 1(e), upper portion 13 is held in closed position to lower portion 15 by way of prongs 39.1 and 39.2 which secure upper portion 15 to lower portion 13. FIGS. 1(d) and 1(e) merely show two examples of ways of which the upper portion 15 may be attached to the lower portion 13. The exact manner of attachment is unimportant so long as the filter apparatus can easily be opened manually to allow access to the inner portion 14. In addition, the exact shape of the housing is unimportant and may take any one of a number of shapes. Moreover, the housing may include other apparatus and other electrical and mechanical devices and need not be limited to only the filter apparatus 10.

The apparatus 10 of FIG. 1 may be termed a "zero-terminal" type filter because there are no direct electrical connections between the filter and the signal carriers 16. The filter therefore has no "terminals" to which the signal carriers are coupled. The embodiment of FIG. 2 shows a "two-terminal" type filter apparatus (40) which embodies the principles of the present invention. Filter apparatus 40 takes the form of a two-terminal filter by use of contact push posts 50.1 and 50.2 which make electrical contact with signal carriers 16.1 and 16.2 respectively. Filter apparatus 40 is similar to filter apparatus 10 described in connection with FIG. 1 except that guide push posts 26.1b and 26.2b of apparatus 10 are replaced in apparatus 40 with contact push posts 50.1 and 50.2. Contact push posts which are shown in side view in FIG. 2(b) maintain the predetermined positional relationship of each signal carrier 16 with respect to ferrite elements 22 and also contain cutting surfaces 52 to pierce insulating material 34 of the signal carrier 16 to form an electrical contact between contact push post 50 and the corresponding signal carrier 16. This advantageously allows a direct electrical connection between the signal carrier 16 and filter elements such as shown in FIG. 2(a) which shows an electrical schematic of a filter implemented by filter apparatus 40. The exact structure of the contact push post 50 is not critical and may take any form which allows the insulating layer of the wire to be pierced to make positive electrical contact with the signal carrier with the conductor 32 of the signal carrier 16 by use of manually applied pressure and without the use of tools.

In FIG. 2(a), the apparatus 40 includes ferrite elements 22.1 and 22.2, a capacitor 54.1 coupled between contact push posts 50.1 and 50.2 and a surge protection device 56.1 which may take the form of a conventional Metal Oxide Varistor (MOV) which is included to protect the capacitor 54. Preferably, the contact push posts 50.1 and 50.2 form a gas tight contact with the corresponding signal carriers 16.1 and 16.2. The filter apparatus shown in FIGS. 2 and 2(a) may be simplified by eliminating the ferrite elements 22, leaving shunt capacitor 54 as the filtering element between the tip and ring conductors 16.2 and 16.1 respectively.

Figure 2C:
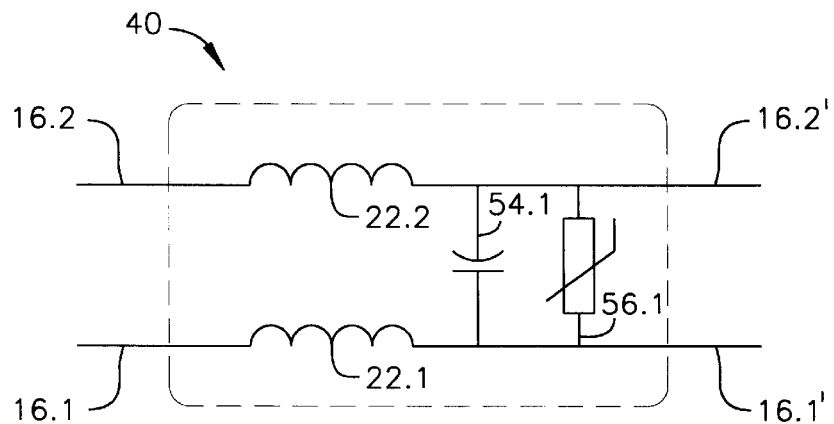
FIG. 2(c) shows a top view of a layout of electrical and mechanical components of the apparatus of FIG. 2.
Figure 2C:
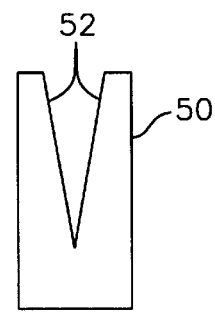
Figure 2C:
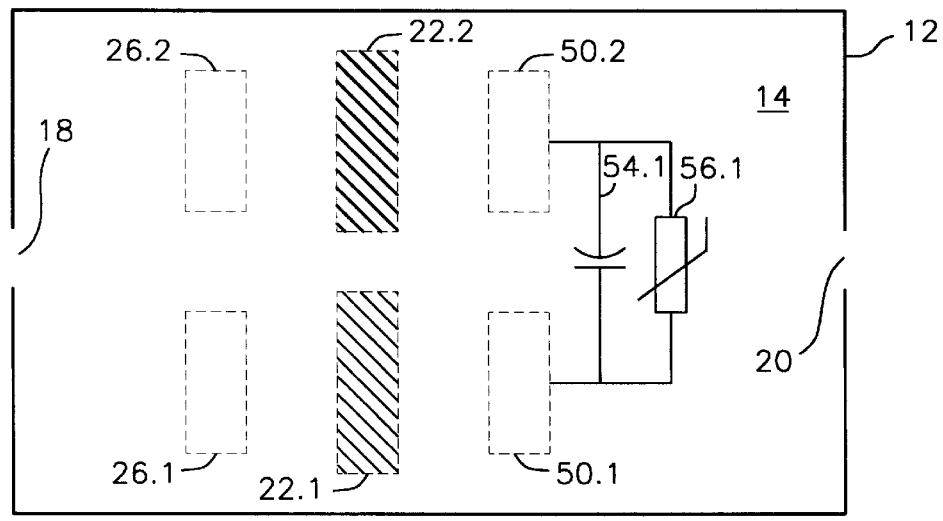

FIG. 2(c) shows a layout of the electrical and mechanical components of the filter apparatus 40 of FIG. 2. As shown in FIG. 2(c), capacitor 54.1 and surge protector 56.1 are coupled between contact push posts 50.1 and 50.2. Guide push posts 26 and contact push posts 50 together maintain signal carriers 16 (not shown in FIG. 2(c)) in predetermined positional relationship with ferrite elements 22. The layout of components shown in FIG. 2(c), as with the corresponding figure of the other embodiments disclosed herein, is merely one example of how the components of the filter apparatus may be placed. The exact layout of components is not critical and numerous layouts may be used, depending upon manufacturing requirements, limitations of the housing 12 or other considerations.

Figure 3:
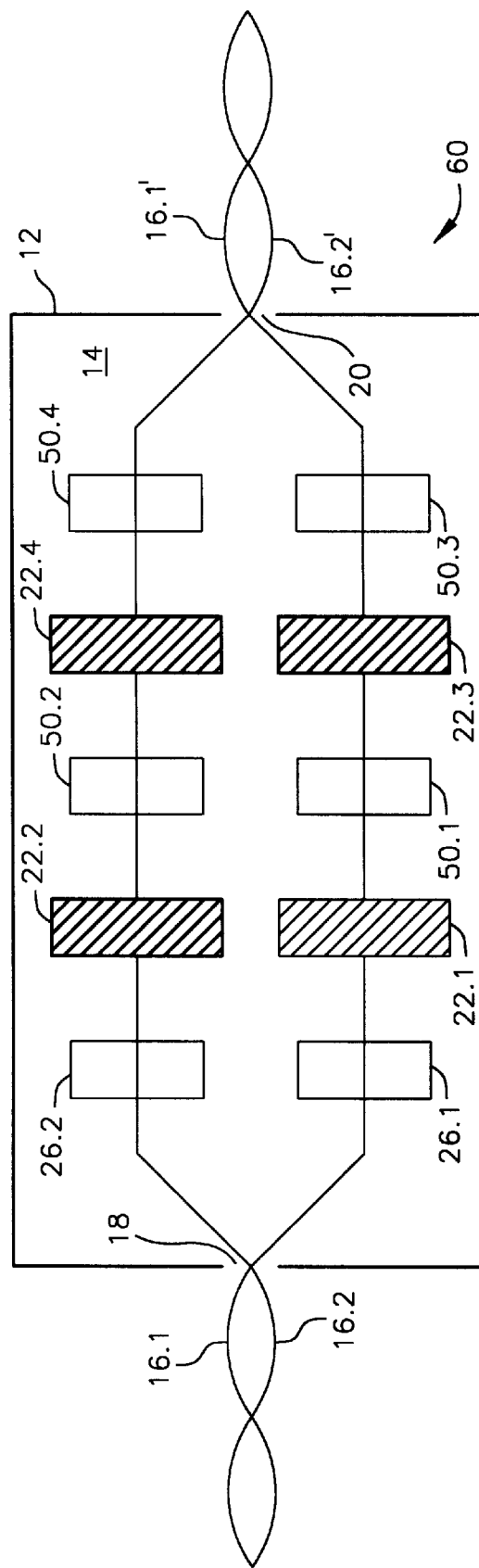
FIG. 3 shows a top view of a third embodiment of an apparatus which employs the principles of the present invention.
Figure 3A:
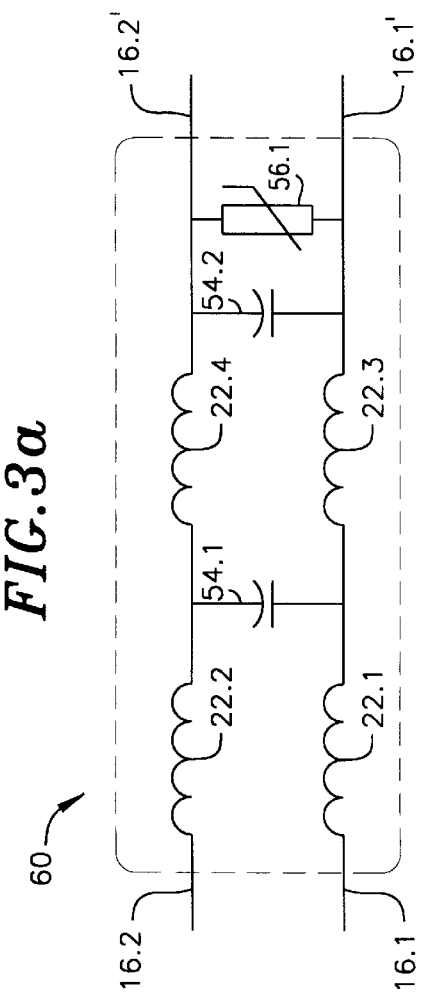
FIG. 3(a) shows an electrical schematic diagram of a filter implemented by the apparatus of FIG. 3.

The filtering characteristics of the filter apparatus 40 of FIG. 2 may be improved by the addition of another pair of contact push posts 50 to allow use of additional ferrite filtering elements in a ladder filter structure. Such an embodiment is shown in FIG. 3. In FIG. 3, an additional pair of contact push posts 50.3 and 50.4 together with an additional pair of ferrite elements 22.3 and 22.4 are added to implement the filter as shown in FIG. 3(a). As shown in FIG. 3(a), the filter apparatus 60 includes ferrite elements 22.1, 22.2, 22.3 and 22.4. Capacitive elements 54.1 and 54.2 are coupled by way of contact pushposts 50 to signal carriers 16. Surge protector 56.1 is coupled in parallel between contact push posts 50.3 and 50.4. Capacitor 54.1 is coupled between contact push posts 50.1 and 50.2. Guide push post 26.1 and contact push post 50.1 maintain signal carrier 16.1 in predetermined positional relationship with ferrite element 22.1 and contact push posts 50.1 and 50.3 maintain signal carrier 16.1 in predetermined positional relationship with ferrite element 22.3. Guide push post 26.2 and contact push post 50.2 maintain signal carrier 16.2 in predetermined positional relationship with ferrite element 22.2 and contact push posts 50.2 and 50.4 maintain signal carrier 16.2 in predetermined positional relationship with ferrite element 22.4.

Figure 3B:
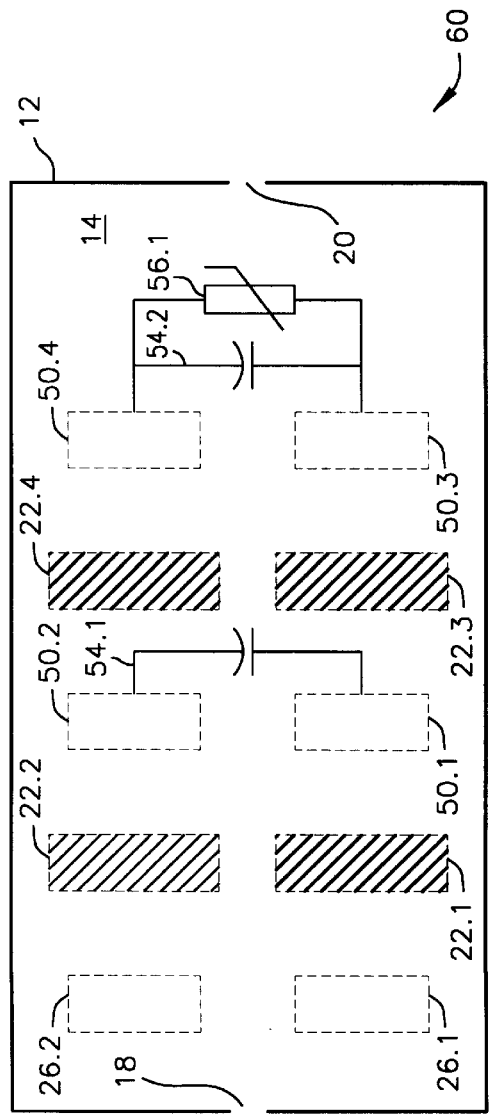
FIG. 3(b) shows a top view of a layout of electrical and mechanical components of the apparatus of FIG. 3.

FIG. 3(b) shows a top view of a component layout of the elements of FIG. 3. As seen in FIG. 3(b), capacitor 54.1 is connected between contact push posts 50.1 and 50.2 and capacitor 54.2 is connected between contact push posts 50.3 and 50.4, as is surge protector 56.

FIG. 4 shows an embodiment of a four-terminal device 80 where general arbitrary order high quality LC ladder filters are constructed using capacitors and wire wound inductors. For a four terminal device such as shown in FIG. 4 to be realized, the signal carriers 16.1 and 16.2 must be severed and electrical connections must be made in each of the resulting four signal carriers 16.1 and 16.2 and 16.1' and 16.2'. Electrical contact with each of the resulting four signal carriers is made by contact push posts 50.1, 50.2, 50.3 and 50.4. The signal carriers may be severed by way of a cutting element 70 shown in side view in FIGS. 4(c) and 4(d). Cutting element 70 is shown in an open position in FIG. 4(c). Wires 16.1 and 16.2 are shown in cross-section placed upon a lower portion 72 of cutting element 70. Cutting element 70 also includes an upper portion 74 which has on a lower surface a cutting portion 76. Cutting portion 76 may be constructed of the same material as upper portion 74 or may be constructed of a different material than upper portion 74. Upper portion 74 is depressed manually onto signal carriers 16 into closed position as shown in FIG. 4(d). Upper portion 74 is rotatably coupled to lower portion 72 by way of a hinge type mechanism 78 and is maintained in closed position by any one of conventional means including a detent mechanism in hinge 78 or a prong or similar type device as shown at 82 to hold upper portion 74 tight against lower portion 72. Once cut, it is not necessary for upper portion 74 to be held in tightly closed position as shown in FIG. 4(d). However, the severed ends of the signal carrier 16 should not contact one another and holding the cutting element in a closed position physically blocks one end of the signal carrier from the other, thus preventing any electrical contact between the two ends of the severed signal carrier. The portion of the cutting element which contacts the signal carrier in the closed position must be non-conducting in order to prevent the cutting element from serving as a conductor to carry electrical signals from one severed end of a signal carrier to another end of the same or other signal carrier. Thus, if the cutting portion 76 of the upper portion 74 is a conducting material, in a closed position the cutting portion should be buried into the lower portion 72 by way of a groove or the like to prevent electrical contact between the cutting portion 76 and signal carrier 16. It should be noted that the exact structure and operation of the cutting element 70 is not critical. The cutting element can take any one of number of different forms so long as it enables severing of signal carriers 16 without the use of tools.

Figure 4A:
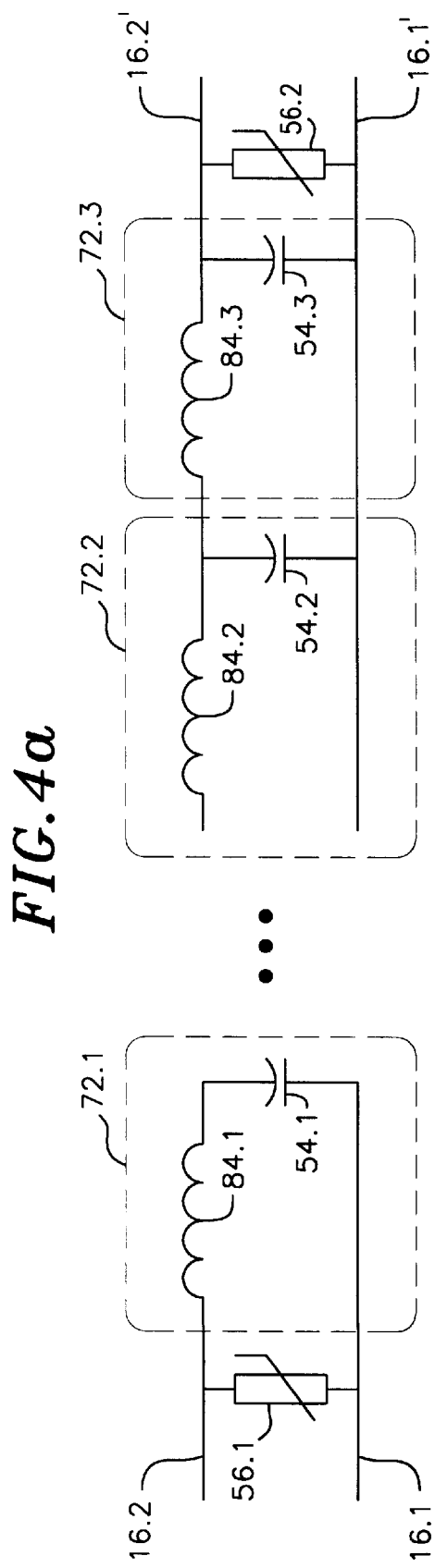
FIG. 4(a) shows an electrical schematic diagram of a filter implemented by the apparatus of FIG. 4.

FIG. 4(a) shows an electrical schematic diagram of a filter realized in accordance with the filter apparatus 80 shown in FIG. 4. As shown in FIG. 4(a), a plurality of LC-type ladder structures may be implemented as shown as 72.1, 72.2, and 72.3 using inductive elements 84 and capacitive elements 54. In addition, surge protectors 56.1 and 56.2 may be used at both ends of the filter structure. It should be noted that severing the signal carriers 16 allows the use of inductive elements 84 which take the form of conventional inductors connected in series with signal carrier 16.2 as opposed to the inductive ferrite element 22.

Figure 4B:
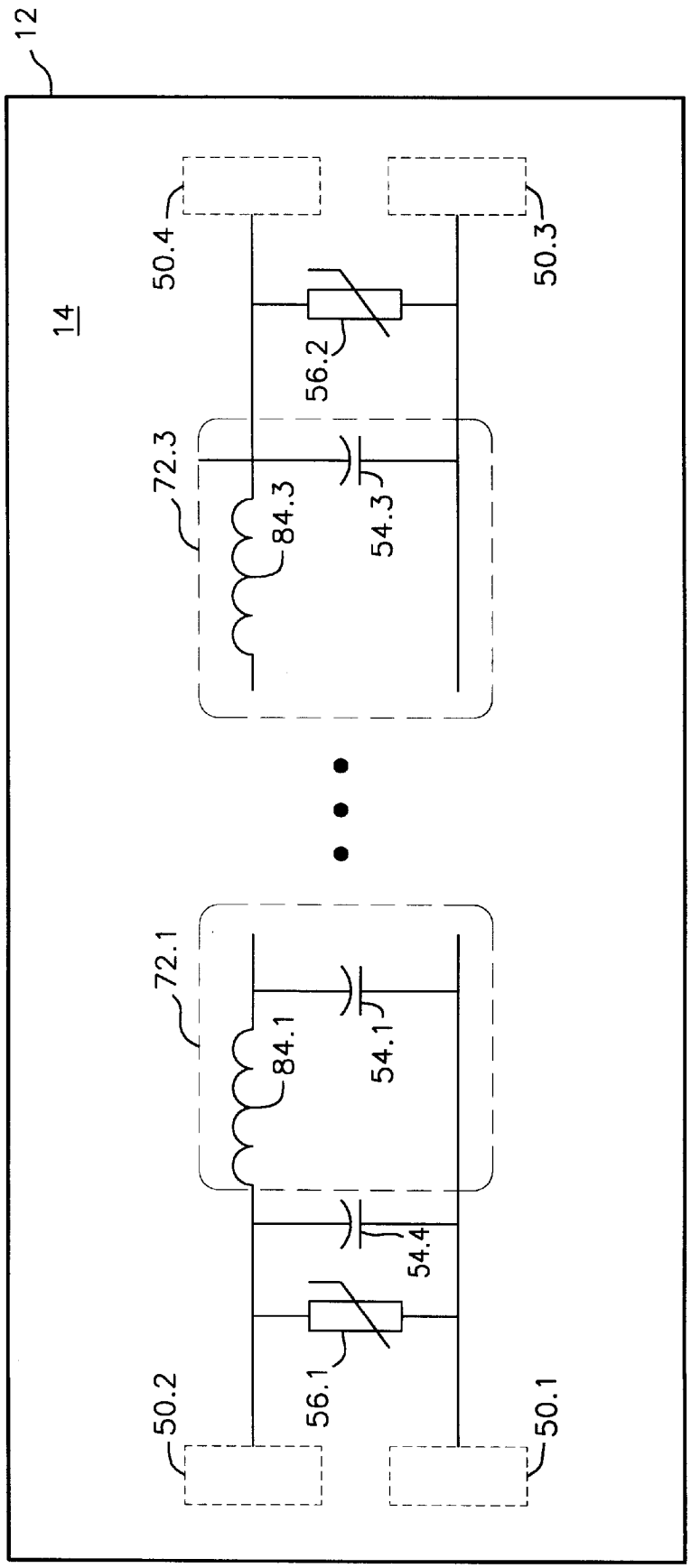
FIG. 4(b) shows a top view of a layout of electrical and mechanical components of the apparatus of FIG. 4.
Figure 4C:
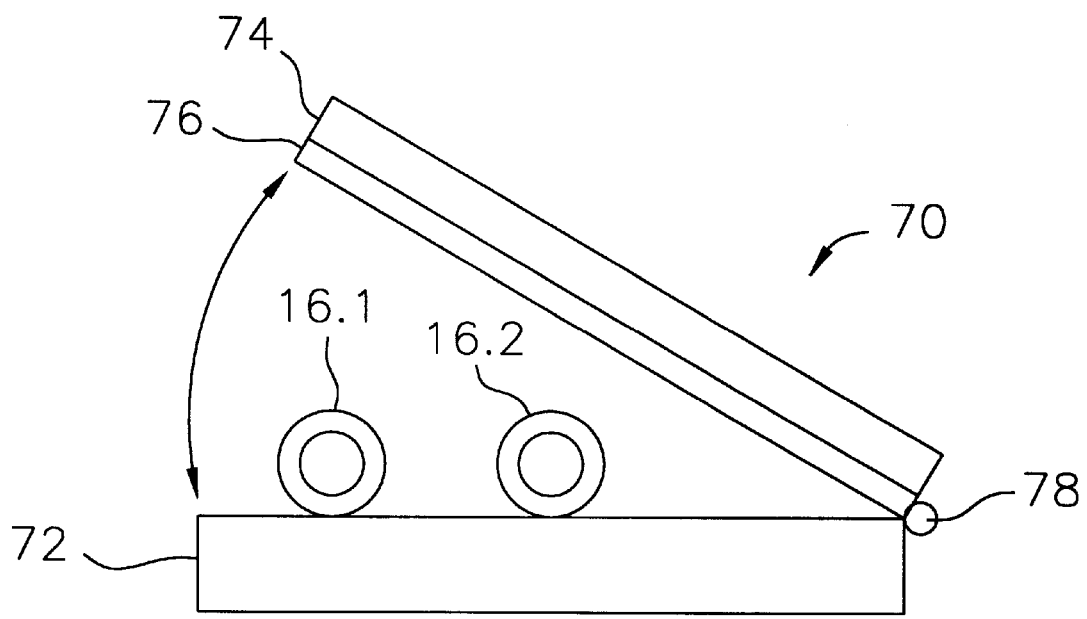
FIG. 4(c) shows a side view of element 70 of FIG. 4 in an open position.
Figure 4D:
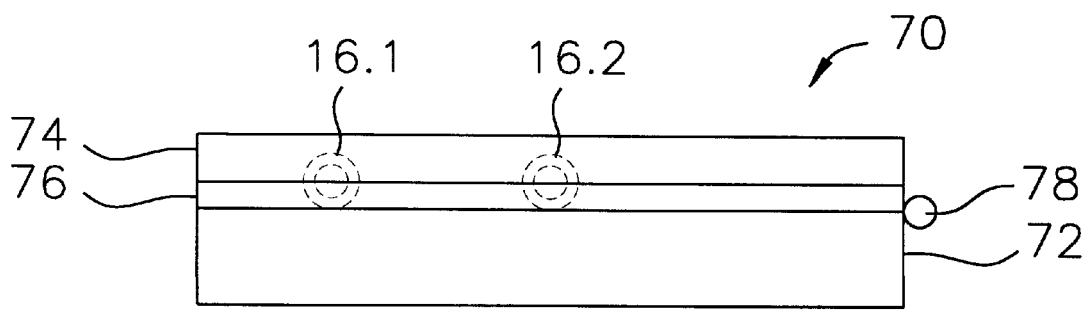
FIG. 4(d) shows a side view of element 70 of FIG. 4 in a closed position.

FIG. 4(b) shows a top view of the layout of the components of the filter apparatus 80. Contact push posts 50.1, 50.2, 50.3 and 50.4 implement four terminals to which the surge protectors 56 and LC-type ladder structures 72 are connected. Capacitor 54.4 in FIG. 4(b) (which is not shown in FIG. 4(a)) may be used to implement an odd order filter.

The filters shown and described herein all take the form of low pass filters which attenuate signals above a particular frequency range. It will be appreciated by those skilled in the art in view of the present disclosure, that the filter apparatus of FIGS. 1, 2, 3 and 4 may be modified with additional and/or different components to achieve a multi-band type filter incorporating high pass and low pass portions to filter electrical signals in two or more frequency ranges. Except as specifically noted herein, the specific mechanisms and techniques which have been described are merely illustrative of exemplary applications of the principles of the present invention. Numerous modifications in addition to those described herein may be made to the methods and apparatus described herein without departing from the true spirit and scope of the invention.

What is claimed is:

1. A contact-less filter system adapted to be manually affixed to a respective pair of unshielded twisted pair (UTP) wiring, the contact-less filter system comprising:

a housing, including upper and lower portions configured to mate together upon closure so as to define an interior volume therebetween;

a differential mode filter disposed within the interior volume, the differential mode filter formed to define guide receptacles, each receptacle holding a respective wire of a UTP pair, the receptacles displaced laterally so as to separate the secure individual first and second wires of a UTP pair.

2. The contact-less filter system of claim 1, each wire of the UTP pair characterized by a conductor portion surrounded by an insulation portion, wherein the differential mode filter comprises first and second ferrite elements, each ferrite element inductively coupled to a respective first and second wire of the UTP pair without making a physical electrical contact with a conductor portion of either wire.

3. The contact-less filter system of claim 2, the differential mode filter comprising:

an upper filter portion disposed on an interior surface of the upper portion of the housing;

a lower filter portion disposed on an interior surface of the lower portion of the housing; and wherein said guide receptacles are formed to define a width and height substantially equal to a diameter of a UTP wire, the upper and lower filter portions aligned to make electrical contact with one another upon closure of the housing so as to substantially enclosed each wire within a guide receptacle thereby inductively coupling a ferrite element in series with each respective first and second wire of the UTP pair.

4. The contact-less filter system of claim 3, further comprising securing means disposed within the interior volume of the housing, the securing means aligned with the guide receptacles and dimensioned to receive a UTP wire, the securing means positioning a wire in a registration with a guide receptacle and securing said wire against lateral displacement as the housing is closed over the UTP pair.

5. The contact-less filter system of claim 4, wherein the first and second ferrite elements are each further divided into upper and lower filter portions, the first and second ferrite elements laterally spaced-apart and electrically isolated from one another so as to each be independently inductively coupled in series with a respective one of the first and second wires of the UTP pair.

6. The contact-less filter system of claim 4, wherein the differential mode filter comprises a ferrite block, further divided into upper and lower filter portions, the ferrite block having guide receptacles formed therein, the guide receptacles laterally spaced-apart and each holding a respective wire so as to define substantially independent inductive couplings, each in a series with a respective one of the first and second wires of the UTP pair.

7. The contact-less filter system of claim 4, wherein the guide receptacles are formed on the lower filter portion.

8. The contact-less filter system of claim 4, wherein the guide receptacles are formed as upper and lower receptacle portions, the lower receptacle portion disposed on the lower filter portion, the upper receptacle portion disposed on the upper filter portion.

9. A filter system adapted to be manually affixed to a respective pair of unshielded twisted pair (UTP) wiring, the filter system comprising:
    a housing, including upper and lower portions configured to mate together upon closure so as to define an interior volume therebetween;
    a first contact-less differential mode filter disposed within the interior volume, the first differential mode filter formed to define guide receptacles, each receptacle holding a respective wire of a UTP pair, the receptacles displaced laterally so as to separate the secure individual first and second wires of a UTP pair.

10. The filter system of claim 9, each wire of the UTP pair characterized by a conductor portion surrounded by an insulation portion, wherein the first differential mode filter comprises first and second ferrite elements, each ferrite element inductively coupled to a respective first and second wire of the UTP pair without making a physical electrical contact with a conductor portion of either wire.

11. The filter system of claim 10, further comprising first securing means disposed within the interior volume of the housing, the first securing means aligned with the guide receptacles and dimensioned to receive a UTP wire, the first securing means positioning a wire in registration with a guide receptacle and securing said wire against lateral displacement as the housing is closed over the UTP pair.

12. The filter system of claim 11, further comprising second securing means disposed within the interior volume of the housing, the second securing means aligned with the guide receptacles and dimensioned to receive a UTP wire.

13. The filter system of claim 12, the second securing means comprising a first pair of insulation displacement contacts, each insulation displacement contact making electrical contact with a respective one of the first and second wires of the UTP pair.

14. The filter system of claim 13, further comprising a first passive filter element coupled between the first pair of insulation displacement contacts in parallel with the first and second wires of the UTP pair.

15. The filter system of claim 14, further comprising a protection circuit coupled between the first pair of insulation displacement contacts in parallel with the first passive filter element.

16. The filter system of claim 15, further comprising a second contact-less differential mode filter the second differential mode filter formed to define guide receptacles, each receptacle holding a respective wire of a UTP pair, the receptacles of the second differential mode filter aligned with the receptacles of the first differential mode filter.

17. The filter system of claim 16, further comprising a second pair of insulation displacement contacts disposed between the first and second contact-less differential mode filter, each of the second insulation displacement contacts making electrical contact with a respective one of the first and second wires of the UTP pair.

18. The filter system of claim 17, further comprising a second passive filter element coupled between the second pair of insulation displacement contacts in parallel with the first and second wires of the UTP pair.

19. The filter system of claim 18, wherein the first and second passive filter elements comprise capacitor elements.

20. The filter system of claim 19, wherein the first and second ferrite elements are each further divided into upper and lower filter portions, the first and second ferrite elements laterally spaced-apart and electrically isolated from one another so as to be each independently inductively coupled in series with a respective one of the first and second wires of the UTP pair.

21. The filter system of claim 20, wherein the second differential mode filter comprises first and second ferrite elements, each further divided into upper and lower filter portions, the first and second ferrite elements laterally spaced-apart and electrically isolated from one another so as to be each independently inductively coupled in series with a respective one of the first and second wires of the UTP pair.

22. The filter system of claim 21, wherein the first and second differential mode filters each comprise a ferrite block, further divided into upper and lower filter portions, each ferrite block having guide receptacles formed therein, the guide receptacles laterally spaced-apart and each holding a respective wire so as to define substantially independent inductive couplings, each in series with a respective one of the first and second wires of the UTP pair.

23. A filter system adapted to be manually affixed to first and second wires making up a selected pair of unshielded twisted pair (UTP) wiring, the filter system comprising:
    a housing, including upper and lower portions configured to mate together upon closure so as to define an interior volume therebetween, the upper and lower housing portions containing the first and second wires within the interior volume in un-twisted condition;
    a first filter coupled in series with the first wire;
    a second filter coupled in series with the second wire; and
    wherein the first and second filters define a differential mode filter element with respect to the first and second wires of the UTP pair.

24. The filter system of claim 23, further comprising:
    a first passive filter element coupled between the first and second wires; and
    a protection device coupled in parallel with the first passive filter element.

25. The filter system of claim 24, further comprising:
    a third filter coupled in series with the first wire;
    a fourth filter coupled in series with the second wire;
    a second passive filter element coupled between the first and second wires; and
    wherein the third and fourth filters are disposed in series with the first and second filters and wherein the first passive filter element is separated from the second passive filter element by one of the filter pairs.

26. The filter system of claim 25, wherein the first, second, third and fourth filters comprise ferrite elements, each ferrite element inductively coupled to a respective first and second wire without making a physical electrical contact.

27. The filter system of claim 26, wherein at least one of the first and second passive filter elements comprises a capacitor.

28. A filter system adapted to be manually affixed to first and second wires making up a selected pair of unshielded twisted pair (UTP) wiring, the filter system comprising:

a housing, including upper and lower portions configured to mate together upon closure so as to define an interior volume therebetween, the upper and lower housing portions containing the first and second wires within the interior volume in un-twisted condition;

a first filter element disposed within the housing and coupled in series with the first wire;

a second filter element disposed within the housing and coupled between the first and second wires and in parallel with the first filter element; and wherein the first and second filter elements define a first filter with respect to the first and second wires of the UTP pair.

29. The filter system of claim 28, further comprising securing means disposed within the interior volume of the housing, the securing means dimensioned to receive a UTP wire, the securing means positioning a wire in registration with the first and second filter elements and securing said wire against lateral displacement as the housing is closed over the UTP pair.

30. The filter system of claim 29, further comprising:

a third filter element disposed within the housing and coupled in series with the first wire;

a fourth filter element disposed within the housing and coupled between the first and second wires and in parallel with the third filter element; and wherein the third and fourth filter elements define a second filter with respect to the first and second wires of the UTP pair, the second filter in series with the first filter.

31. The filter of claim 30, wherein the first and third filter elements comprise inductors.

32. The filter system of claim 30, wherein the second and fourth filter elements comprise capacitors, the first and second filters defining respective LC ladder-type filters.

33. The filter system of claim 32, further comprising a plurality of LC ladder-type filters disposed within the housing and in series with the first and second LC ladder-type filters.

34. The filter system of claim 33, further comprising a plurality of pairs of insulation displacement contacts, each pair associated with a respective capacitor of each LC ladder-type filter, each one of a contact pair contacting a respective first or second wire of a UTP pair, each capacitor coupled between a contact pair.

* * * * *